United States Patent [19]

Hanaie et al.

[11] Patent Number: 5,001,442

[45] Date of Patent: Mar. 19, 1991

[54] OSCILLATION CONTROL APPARATUS FOR ULTRASONIC OSCILLATOR

[75] Inventors: Tsugitaka Hanaie; Kunio Iwaki; Yorimi Yokoyama, all of Kanagawa, Japan

[73] Assignee: Stanley Electric Co., Ltd., Tokyo, Japan

[21] Appl. No.: 517,348

[22] Filed: May 1, 1990

[30] Foreign Application Priority Data

May 30, 1989 [JP] Japan .................................. 1-163125

[51] Int. Cl.$^5$ ................................................ H03L 7/06

[52] U.S. Cl. ....................................... 331/25; 310/316

[58] Field of Search .................. 331/25, 158; 310/316, 310/317

[56] References Cited

U.S. PATENT DOCUMENTS 4,879,528 11/1989 Gotanda ........................ 331/158 X

*Primary Examiner*—Robert J. Pascal

*Attorney, Agent, or Firm*—Nixon & Vanderhye

[57] ABSTRACT

In an oscillation control apparatus for an ultrasonic oscillator, an FET circuit is connected to an oscillation circuit for varying a resistant value of a resistor unit of the oscillation circuit, which determines a free-running frequency thereof. A phase-difference detecting circuit is provided for detecting a relative phase difference between voltage and current in the ultrasonic oscillator. A threshold discrimination circuit outputs a signal when the phase difference inputted from the phase-difference detecting circuit exceeds at least a predetermined value. A pump circuit integrates the signal from the threshold discrimination circuit. A resistant value of the FET circuit varies when an output signal from the pump circuit exceeds a predetermined value.

6 Claims, 3 Drawing Sheets

OSCILLATION CONTROL APPARATUS FOR ULTRASONIC OSCILLATOR

BACKGROUND OF THE INVENTION

The present invention relates to oscillation control apparatuses for ultrasonic oscillators for doing ultrasonic machining and, more particularly, to an oscillation control apparatus for controlling a drive frequency of an ultrasonic oscillator so as to render, zero, a phase difference between driving voltage and driving current of the ultrasonic oscillator.

Generally, as shown, for example, in FIG. 3 of the attached drawings, a ultrasonic oscillation device 1 comprises an oscillation circuit 2, which generates a pulse signal with a high free-running frequency $f_0$. According to the pulse signal, a high-frequency pulse signal of the frequency $f_0$ is outputted from a drive circuit 3 and is applied to an ultrasonic oscillator 5 via a transformer 4, so that the ultrasonic oscillator 5 is ultrasonic-oscillated at the drive frequency $f_0$, thereby doing ultrasonic machining.

During ultrasonic machining, when a load is applied to the ultrasonic oscillator 5 for the machining, an oscillation frequency of the ultrasonic oscillator 5 is altered or changed from $f_0$ to $f_1$, whereby, as shown in FIG. 4, a phase shift occurs between driving voltage V and driving current I of the ultrasonic oscillator 5. Thus, an efficiency is reduced. For this reason, the oscillation frequency $f_1$ of the ultrasonic oscillator 5 with respect to the free-running frequency $f_0$ is detected by a piezoelectric element 6 or the like and is fed-back to the oscillation circuit 2, whereby the oscillation circuit 2 alters the free-running frequency from $f_0$ to $f_1$.

In the vibration control device 1 constructed as above, however, if there is a large difference between the free-running frequency $f_0$ and the oscillation frequency $f_1$ of the ultrasonic oscillator 5, the oscillation frequency is $f_1$, but the phase difference between the voltage V and the current I is large so that optimum tracking is not done.

SUMMARY OF THE INVENTION

It is therefore an object of the invention to provide an oscillation control apparatus for an ultrasonic oscillator, in which a free-running frequency varies and approaches an oscillation frequency whereby, if a phase difference is relatively large, optimum phase correction is possible.

For the above purpose, according to the invention, there is provided an oscillation control apparatus for an ultrasonic oscillator, comprising:

an oscillation circuit having resistor means;

a drive circuit for driving the ultrasonic oscillator on the basis of a drive frequency generated by the oscillation circuit;

an oscillation detector for detecting an oscillation frequency of the ultrasonic oscillator to feed-back the oscillation frequency to the oscillation circuit;

an FET circuit connected to the oscillation circuit for varying a resistant value of the resistor means of the oscillation circuit, which determines a free-running frequency thereof;

a phase-difference detecting circuit for detecting a relative phase difference between voltage and current in the ultrasonic oscillator;

a threshold discrimination circuit for outputting a signal when the phase difference inputted from the phase-difference detecting circuit exceeds at least a predetermined value; and a pump circuit for integrating the signal from the threshold discrimination circuit, wherein a resistant value of the FET circuit varies when an output signal from said pump circuit exceeds a predetermined value.

With the arrangement of the invention, when the phase difference between the voltage and the current of the ultrasonic oscillator exceeds the predetermined level, a variable resistant characteristic of the FET circuit is utilized to vary the resistant value of the resistor means which determines the free-running frequency of the oscillation circuit. By doing so, it is possible to alter the free-running frequency of the oscillation circuit. Thus, if the resistant value after the alternation is set to such a resistant value as to reduce the phase difference between the voltage and the current, it is possible to control the free-running frequency of the oscillation circuit so as to correct the phase difference in the case of the smaller phase difference.

Further, the signal from the threshold discrimination circuit tis inputted to the FET circuit after the signal from the threshold discrimination circuit has been integrated by the pump circuit. Accordingly, there is a constant delay time from the time the phase difference increases to a value at least equal to the predetermined level to the time the resistant value of the FET circuit varies. In this manner, in the case where the phase difference exceeds the predetermined level in a moment, the resistant value of the FET circuit does not vary. Accordingly, the resistant value does not inadvertently vary. Thus, it is possible to control the free-running frequency reliably and in an optimum manner.

As described above, according to the invention, there is provided the superior oscillation control apparatus for the ultrasonic oscillator, in which, in the case where the phase difference is relatively large, optimum phase correction is possible.

DETAILED DESCRIPTION

Figure 1:
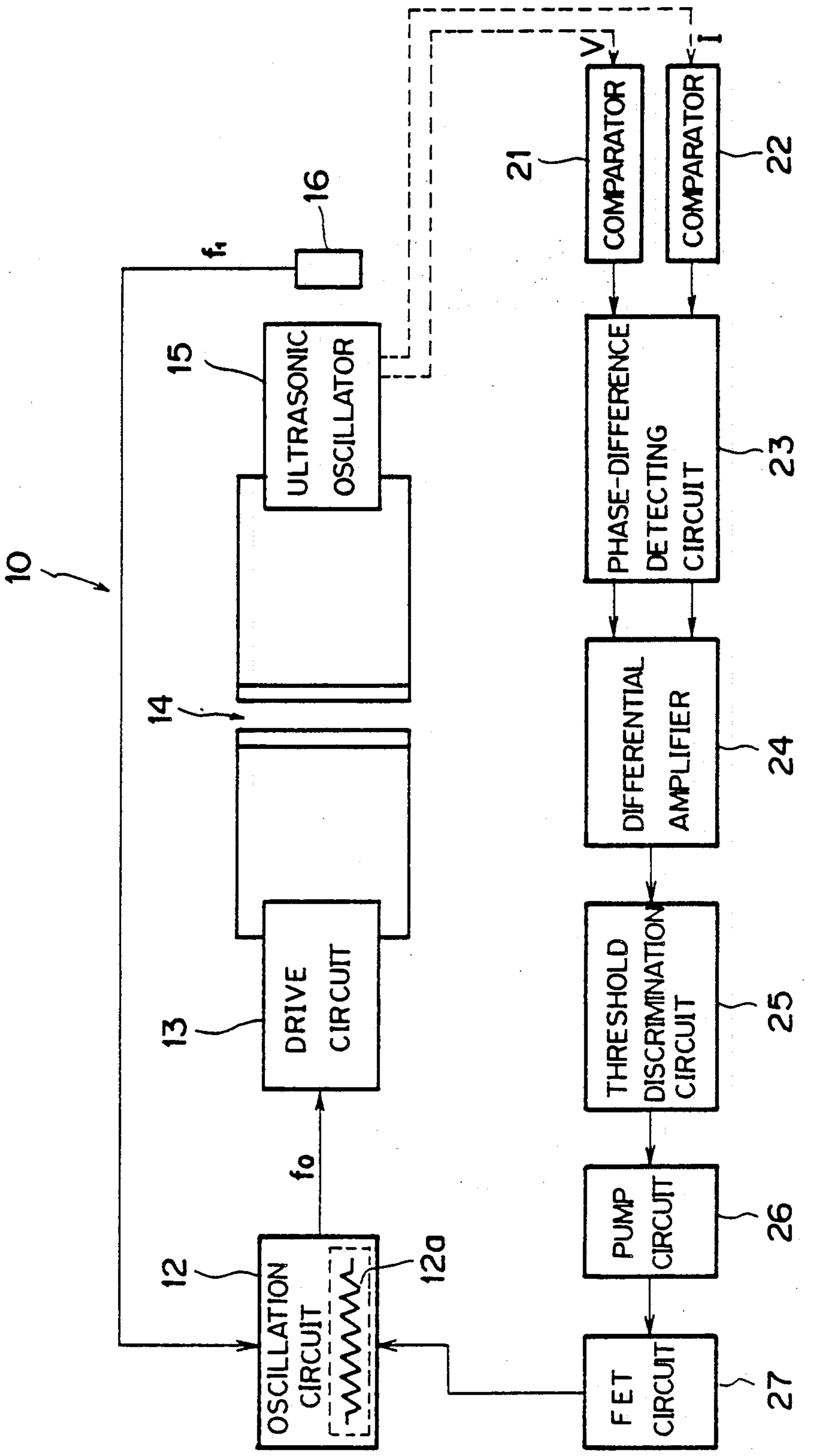
FIG. 1 is a block diagram showing an oscillation control apparatus for an ultrasonic oscillator, according to an embodiment of the invention.
Figure 3:
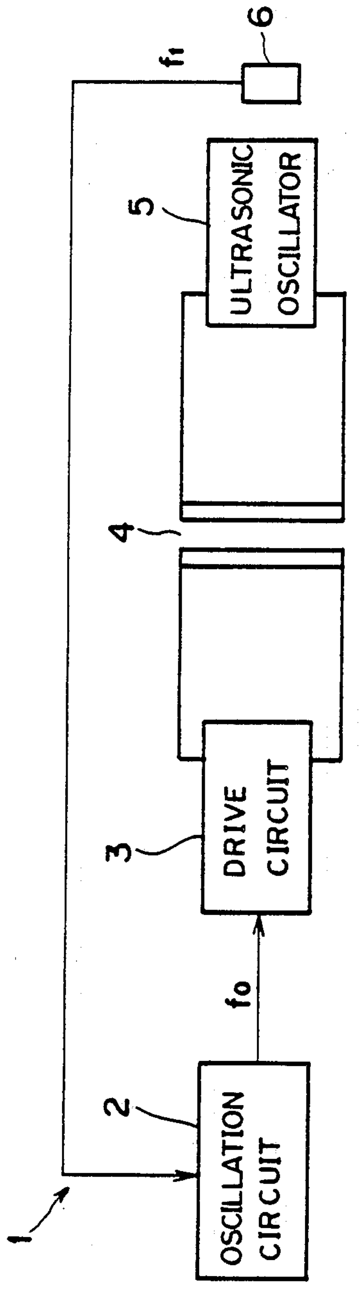
FIG. 3 PRIOR ART
FIG. 3 is a block diagram showing the conventional ultrasonic oscillation device for an ultrasonic oscillator.
Figure 4:
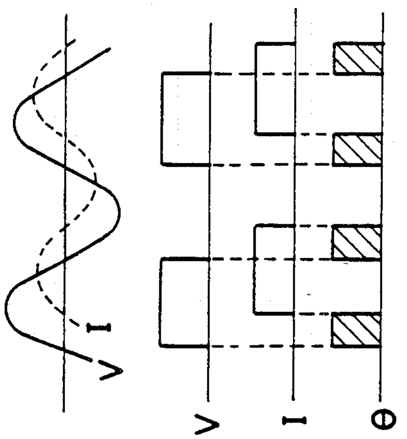
FIG. 4 PRIOR ART
FIG. 4 is a graphical representation of a phase between driving voltage and driving current of the ultrasonic oscillator illustrated in FIG. 3.

Referring to FIG. 1, there is shown an oscillation control apparatus for an ultrasonic oscillator, generally designated by the reference numeral 10, according to an embodiment of the invention. The oscillating control apparatus 10 is added to the ultrasonic oscillation device 1 illustrated in FIG. 3. Accordingly, components like or similar to those illustrated in FIG. 3 are designated by the reference numerals in which ten (10) is added to the reference numerals used in FIG. 3, and the description of such like or similar components will be simplified.

The oscillation control apparatus 10 for an ultrasonic oscillator 15 comprises a pair of comparators 21 and 22. The pair of comparators 21 and 22 are connected between the ultrasonic oscillator 15 and a phase-shift or phase-difference detecting circuit 23. Driving voltage V and driving current I of the ultrasonic oscillator 15 are inputted respectively to the pair of comparators 21 and 22 to output their respective signals corresponding to a phase difference between the driving voltage V and the driving current I. The signals from the respective comparators 21 and 22 are inputted to the phase-difference detecting circuit 23 so that the phase difference detected by the phase-difference detecting circuit 23 is converted to a DC (direct current) level. That is, on the basis of the signals from the respective comparators 21 and 22, the phase-shift detecting circuit 23 detects lead or lag of the phases of the respective driving voltage and driving current V and I to convert the lead or lag to the DC level.

A differential amplifier 24 is connected between the phase-difference detecting circuit 23 and a threshold discrimination circuit 25. On the basis of a signal from the phase-difference detecting circuit 23, the differential amplifier 24 outputs a signal of the DC level, which corresponds to the phase difference between the voltage V and the current I. The signal from the differential amplifier 24 is inputted to the threshold discrimination circuit 25. The threshold discrimination circuit 25 compares the signal from the differential amplifier 24 with a first level higher than an intermediate value corresponding to zero of the phase difference and with a second level lower than the intermediate value to output a signal of a H(high)-level when the signal from the differential amplifier 24 is equal to or higher than the first level and equal to or lower than the second level.

A pump circuit 26 is connected to the threshold discrimination circuit 25 for integrating the signal from the threshold discrimination circuit 25 to output an integrating signal. An FET (field-effect transistor) circuit 27 is connected between the pump circuit 26 and an oscillation circuit 12 for varying a resistant value of a resistor unit 12*a* of the oscillation circuit 12, which determines a free-running frequency $f_0$ thereof. That is, the FET circuit 27 varies a resistant value of an FET 33 (refer to FIG. 2) such that, when the output from the pump circuit 26 increases to a value equal to or higher than a predetermined level, the FET circuit 27 varies the resistant value of the resistor unit 12 *a* which determines the free-running frequency $f_0$ of the oscillation circuit 12.

Specifically, the FET circuit 27 described above is constructed as shown in FIG. 2, for example. That is, the resistor unit 12*a* of the oscillation circuit 12 comprises a first resistor 30, a variable resistor 31 and a second resistor 32. The first resistor 30 and the variable resistor 31 are connected to each other in series. The second resistor 32 is connected to the first resistor 30 and the variable resistor 31 in parallel relation thereto. The FET circuit 27 comprises the above-mentioned FET 33 connected to the second resistor 32 in series and a transistor 34 connected between the gate of the FET 33 and an earth. The output signal from the pump circuit 26 is inputted to the base of the transistor 34.

The oscillation control apparatus 10 according to the invention is constructed as described above. Similarly to the conventional ultrasonic oscillation device 1 illustrated in FIG. 3, a pulse signal of the free-running frequency $f_0$ is inputted to a drive circuit 13 from the oscillation circuit 12. By doing so, a high-frequency pulse signal of the frequency $f_0$ outputted from the drive circuit 13 is applied to the ultrasonic oscillator 15 through a transformer 14. Thus, the ultrasonic oscillator 15 is ultrasonic-vibrated at the free-running frequency $f_0$ to do ultrasonic machining. An oscillation frequency $f_1$ of the ultrasonic oscillator 15 is detected by an oscillation detecting element 16 such as a piezoelectric element or the like and is fed-back to the oscillation circuit 12. In this manner, the oscillation circuit 12 is so operated that the free-running frequency is altered from $f_0$ to $f_1$.

At this time, the driving voltage V and the driving current I of the ultrasonic oscillator 15 are inputted respectively to the pair of comparators 21 and 22, whereby the signals corresponding to the phase difference between the driving voltage V and the driving current I are outputted respectively from the comparators 21 and 22. These signals are converted, by the phase-difference detecting circuit 23, respectively to a pair of signals of the DC level which correspond to the lead or lag of the phase. The signals of the DC level are compared with each other by the differential amplifier 24, and are outputted as a signal of the DC level which corresponds to the phase difference between the driving voltage V and the driving current I.

The signal outputted from the differential amplifier 24 is compared, by the threshold discrimination circuit 25, with a first level $L_1$ and a second level $L_2$ which are respectively a predetermined value on the + side and a predetermined value on the − side with respect to a zero level that is an intermediate value with respect to zero of the phase difference. If the signal from the differential amplifier 24 is lower than the first level $L_1$ and higher than the second level $L_2$, that is, if the phase difference is smaller in lead or lag than the predetermined level, the threshold discrimination circuit 25 does not output the signal, whereby the output from the pump circuit 26 is maintained zero and, accordingly, the FET circuit 27 does not operate.

Figure 2:
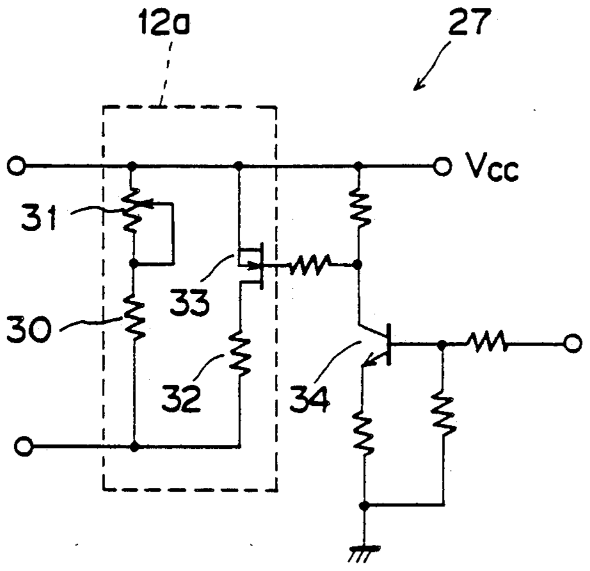
FIG. 2 is a block diagram showing an FET circuit in the embodiment illustrated in FIG. 1.

Specifically, as shown in FIG. 2, since the signal of the L-level is applied to the base of the transistor 34, the transistor 34 is turned off. Since the voltage is applied to the gate of the FET 33, the FET 33 is maintained in continuity. Accordingly, the resistor unit 12*a* is maintained at a first resistant value which is a composite or resultant resistant value of the resistors 30, 31 and 32. For the reason, the frequency $f_1$ is fed-back from the oscillation detecting element 16 to the oscillation circuit 12 so that, similarly to the conventional device, the oscillation circuit 12 alters the free-running frequency from $f_0$ to $f_1$.

If the phase difference between the driving voltage V and the driving current I of the ultrasonic oscillator 15 becomes large, the signal outputted from the differential amplifier 24 is compared with the first level $L_1$ and the second level $L_2$ at the threshold discrimination circuit 25. When the signal from the differential amplifier 24 is higher than the first level $L_1$, or when the signal from the differential amplifier 24 is lower than the second level $L_2$, that is, when the phase difference increases in lead or lag to a value higher than the predetermined level, the threshold discrimination circuit 25 outputs the signal. The signal from the threshold discrimination circuit 25 is integrated by the pump circuit 26. When the output from the pump circuit 26 is brought to the H-level, the FET circuit 27 is operated to alter or vary the resistant value of the resistor unit 12*a* in the oscillation circuit 12. Specifically, as shown in FIG. 2, since the signal of the H-level is inputted to the base of the transistor 34, the transistor 34 is turned on. Accordingly, the voltage applied to the gate of the FET 33 decreases. Since the FET 33 increases in its resistant value, the resistor unit 12*a* is altered to the second resistant value which is the composite resistant value of the resistor 30, 31 and 32 and the FET 33.

In the manner described above, the free-running frequency of the oscillation circuit 12 is converted from $f_0$ to $f_2$. Accordingly, when the frequency $f_1$ is fed-back to the oscillation circuit 12 from the oscillation detecting element 16, the free-running frequency of the oscillation circuit 12 is altered from $f_2$ to $f_1$ so that the phase difference between the voltage V and the current I with respect to the free-running frequency $f_2$ decreases to a value smaller than the phase difference between the voltage V and the current I in the case where the free-running frequency is $f_0$. Thus, the tracking accuracy is improved with respect to the frequency $f_1$ of the oscillation circuit 12.

What is claimed is:

1. An oscillation control apparatus for an ultrasonic oscillation, comprising:

an oscillation circuit having resistor means;

a drive circuit for driving said ultrasonic oscillator on the basis of a drive frequency generated by said oscillation circuit;

an oscillation detector for detecting an oscillation frequency of said ultrasonic oscillator to feed-back the oscillation frequency to said oscillation circuit;

an FET circuit connected to said oscillation circuit for varying a resistant value of said resistor means of said oscillation circuit, which determines a free-running frequency thereof;

a phase-difference detecting circuit for detecting a relative phase difference between voltage and current in said ultrasonic oscillator;

a threshold discrimination circuit for outputting a signal when the phase difference inputted from said phase-difference detecting circuit exceeds at least a predetermined value; and a pump circuit for integrating the signal from said threshold discrimination circuit, wherein a resistant value of said FET circuit varies when an output signal from said pump circuit exceeds a predetermined value.

2. The oscillation control apparatus according to claim 1, further including a pair of comparators connected between said ultrasonic oscillator and said phase-difference detecting circuit for outputting their respective signals corresponding to said phase difference between said voltage and said current, said signals from said pair of comparators being inputted to said phase-difference detecting circuit so that said phase difference detected by said phase-difference detecting circuit is converted to a DC level.

3. The oscillation control apparatus according to claim 2, further including a differential amplifier connected between said phase-difference detecting circuit and said threshold discrimination circuit for outputting a signal of the DC level, which corresponds to the phase difference between said voltage and said current, said signal from said differential amplifier being inputted to said threshold discrimination circuit.

4. The oscillation control apparatus according to claim 3, wherein said threshold discrimination circuit compares the signal from said differential amplifier with a first level higher than an intermediate value corresponding to zero of said phase difference and with a second level lower than said intermediate value to output the signal of a H-level when said signal from said differential amplifier is at lest equal to said first level and at most equal to said second level.

5. The oscillation control apparatus according to claim 1, wherein said resistor means of said oscillation circuit comprises a first resistor, a variable resistor and a second resistor, said first resistor and said variable resistor being connected to each other in series, said second resistor being connected to said first resistor and said variable resistor in parallel relation thereto, and wherein said FET circuit comprises an FET connected to said second resistor in series and a transistor connected between a gate of said FET and an earth, said output signal from said pump circuit being inputted to a base of said transistor.

6. The oscillation control apparatus according to claim 1, further including a transformer through which said drive circuit is connected to said ultrasonic oscillator.

* * * * *